United States Patent
Balasubramanian et al.

(10) Patent No.: US 10,420,254 B2
(45) Date of Patent: Sep. 17, 2019

(54) HEAT SINK ASSEMBLY APPARATUS (71) Applicant: NATIONAL UNIVERSITY OF SINGAPORE, Singapore (SG)

(72) Inventors: Karthik Balasubramanian, Singapore (SG); Poh Seng Lee, Singapore (SG)

(73) Assignee: National University of Singapore, Singapore (SG)

( * ) Notice: Subject to any disclaimer, the term of this patent is extended or adjusted under 35 U.S.C. 154(b) by 451 days.

(21) Appl. No.: 14/356,036

(22) PCT Filed: Nov. 2, 2012

(86) PCT No.: PCT/SG2012/000416
§ 371 (c)(1),
(2) Date: May 2, 2014

(87) PCT Pub. No.: WO2013/066271
PCT Pub. Date: May 10, 2013

(65) Prior Publication Data
US 2014/0311725 A1  Oct. 23, 2014

Related U.S. Application Data (60) Provisional application No. 61/554,546, filed on Nov. 2, 2011.

(51) Int. Cl.
*H05K 7/20* (2006.01)
*F28F 3/04* (2006.01)
(Continued)

(52) U.S. Cl.
CPC .............. *H05K 7/2039* (2013.01); *F28F 3/02* (2013.01); *F28F 3/04* (2013.01); *F28F 3/048* (2013.01);
(Continued)

(58) Field of Classification Search
CPC .... F28F 13/08; F28F 3/048; F28F 3/02; F28F 3/04; H05K 7/2039; H01L 23/473; H01L 23/467
(Continued)

(56) References Cited

U.S. PATENT DOCUMENTS 4,879,891 A    11/1989 Hinshaw
5,072,787 A *  12/1991 Nakamichi ........... H01L 23/467
                                                    165/146
(Continued)

FOREIGN PATENT DOCUMENTS

CA    2729538 A1 *  1/2010  ............... F24H 1/38
EP    2685493 A2 *  1/2014  ............... F28F 13/12
(Continued)

OTHER PUBLICATIONS

Foreign Communication From a Related Counterpart Application, International Search Report dated Jan. 2, 2013, International Application No. PCT/SG2012/000416 filed on Nov. 2, 2012.
(Continued)

*Primary Examiner* — Cassey D Bauer
*Assistant Examiner* — Jenna M Hopkins (57) ABSTRACT A heat sink assembly comprising a heat sink including a plurality of parallel fins, said fins defining a plurality of channels; said heat sink divided into two stages; said first stage positioned in the upstream portion of said heat sink and arranged such that fluid entering the heat sink is under closed channel flow conditions within said plurality of channels and; the second stage positioned in the downstream portion, said second stage including a void above said channels so as to have open channel flow in said channels for fluid exiting said heat sink.

9 Claims, 5 Drawing Sheets (51) Int. Cl.
  H01L 23/473 (2006.01)
  F28F 3/02 (2006.01)
  H01L 23/367 (2006.01)
  F28D 21/00 (2006.01)
  F28F 13/08 (2006.01)
  H01L 23/467 (2006.01)

(52) U.S. Cl.
  CPC .......... F28F 13/08 (2013.01); H01L 23/467 (2013.01); H01L 23/473 (2013.01); *F28D 2021/0029* (2013.01); *F28F 2215/04* (2013.01); *H01L 23/3672* (2013.01); *H01L 2924/0002* (2013.01)

(58) Field of Classification Search
  USPC .................... 165/168, 80.2, 104.33, 80.4
  See application file for complete search history.

(56) References Cited

U.S. PATENT DOCUMENTS

| | | | | |
|---|---|---|---|---|
| 5,514,327 | A * | 5/1996 | Schneider | B22F 5/00 257/E23.102 |
| 5,625,229 | A * | 4/1997 | Kojima | F28F 3/025 257/712 |
| 5,693,981 | A * | 12/1997 | Schneider | H01L 21/4882 165/80.3 |
| 5,763,950 | A * | 6/1998 | Fujisaki | H01L 23/3672 165/80.3 |
| 5,773,886 | A * | 6/1998 | Rostoker | F28F 3/02 165/80.3 |
| 5,814,536 | A * | 9/1998 | Rostoker | H01L 21/4878 257/E23.102 |
| 5,871,043 | A * | 2/1999 | Osakabe | F28D 15/0233 165/104.21 |
| 6,522,540 | B2 | 2/2003 | Sakaiya et al. | |
| 6,622,786 | B1 * | 9/2003 | Calmidi | F28F 3/022 165/122 |
| 6,970,353 | B2 * | 11/2005 | Brovald | G06F 1/20 165/121 |
| 8,009,417 | B2 * | 8/2011 | Searby | G06F 1/20 165/104.33 |
| 8,069,681 | B1 * | 12/2011 | Cink | F24F 3/1405 62/176.1 |
| 9,414,525 | B2 * | 8/2016 | Campbell | H05K 7/2039 |
| 2002/0139515 | A1 * | 10/2002 | Azar | F28F 3/02 165/80.3 |
| 2004/0112571 | A1 | 6/2004 | Kenny et al. | |
| 2004/0228781 | A1 * | 11/2004 | Tonkovich | B01D 53/0407 422/222 |
| 2008/0073061 | A1 | 3/2008 | Dias et al. | |
| 2008/0074845 | A1 * | 3/2008 | Sun | H01L 23/467 361/712 |
| 2008/0236793 | A1 * | 10/2008 | Ma | F04B 43/04 165/80.4 |
| 2008/0308258 | A1 | 12/2008 | Pan et al. | |
| 2009/0139701 | A1 | 6/2009 | Qu | |
| 2009/0145581 | A1 * | 6/2009 | Hoffman | F28F 1/40 165/80.3 |
| 2010/0032139 | A1 * | 2/2010 | Tian | H01L 23/467 165/104.31 |
| 2010/0172091 | A1 * | 7/2010 | Nishiura | H01L 23/3735 361/689 |
| 2011/0286178 | A1 * | 11/2011 | Bridges | F28F 3/048 361/679.54 |
| 2011/0315358 | A1 * | 12/2011 | Lin | H01L 23/3672 165/121 |
| 2012/0012294 | A1 * | 1/2012 | Miki | B61C 17/00 165/185 |
| 2012/0138266 | A1 * | 6/2012 | Yamada | F28D 9/0006 165/104.11 |
| 2012/0152498 | A1 | 6/2012 | Lyon | |
| 2013/0048255 | A1 * | 2/2013 | Xia | H01L 23/3672 165/121 |
| 2013/0199770 | A1 * | 8/2013 | Cherian | F28F 3/00 165/185 |
| 2013/0240195 | A1 * | 9/2013 | Chen | F28F 3/02 165/185 |
| 2015/0181756 | A1 * | 6/2015 | Sato | B60L 11/1877 165/64 |

FOREIGN PATENT DOCUMENTS

JP  WO 2010109799 A1 * 9/2010
WO    2013066271 A1    5/2013

OTHER PUBLICATIONS

Kandlikar, et al., "Stabilization of Flow Boiling in Microchannels Using Pressure Drop Elements and Fabricated Nucleation Sites", Journal of Heat Transfer, Apr. 2006, vol. 128.
Muwanga, R., et al., "Characteristics of Flow Bioling Oscillations in Silicon Microchannel Heat Sinks", Journal of Heat Transfer, Oct. 2007, vol. 129.
Lu, Chun Ting, et al., "Stabilization of Flow boiling in microchannel heat sinks with a diverging cross-section design", Journal of Micromechanics and Microengineering, 2008, vol. 18.
Zhang, TieJun, et al., "Analysis and active control of pressure-drop flow instabilities in boiling microchannel systems", International Journal of Heat and Mass Transfer, 2010, vol. 53.
Kuo, C.-J., et al., "Flow Boiling Instabilities in Microchannels and Means for Mitigation by Reentrant Cavities", Journal of Heat Transfer, Jul. 2008, vol. 130.
Mukherjee, A., et al., "The effect of inlet constriction on bubble growth during flow boiling in microchannels", International Journal of Heat and Mass Transfer, 2009, vol. 52.
Lee, Hee Joon, et al., "Flow instability of evaporative microchannels", International Journal of Heat and Mass Transfer, 2010, vol. 53.
Boure, J.A., et al., "Review of Two-Phase Flow Instability", Nuclear Engineering and Design, 1973, vol. 25.
Ishii, M., "Study on flow instabilities in two flow mixtures", Report ANL, Argonne National Laboratory 1976.
Yadigaroglu, G., "Two-Phase Flow Instabilities and Propagation Phenomena", Thermohydrolics of Two-phase Systems for Industrial Design and Nuclear Engineering, 1981.
Tadrist, L., "Review on two-phase flow instabilities in narrow spaces", International Journal of Heat and Fluid Flow 2007, vol. 28.
Kandlikar, Satish G., et al., "High-speed Photographic Observation of Flow Boiling in Water in Parallel Mini-Channels", Proceedings of NHTC'01, 35th National Heat Transfer Conference, Jun. 10-412, 2001, California.
Kandlikar, Satish G., et al., "An Experimental Study on the Effect of Gravitational Orientation on Flow Boiling Water in 1054X197[micrometer] Parallel Minichannels", Jounral of Heat Transfer, ASME, 2005, vol. 127.
Hestroni, G., et al., "Convective Boiling in Parallel Microchannels", Nanoscale and Microscale Thermophysical Engineering, ASME, 2003.
Peles, Y., "Two-Phase Boiling Flow in Microchannels—Instabilities Issues and Flow Regime Mapping", First International Conference on Micro-channels and Mini-channels, ASME Apr. 2003.

* cited by examiner

HEAT SINK ASSEMBLY APPARATUS

CROSS-REFERENCE TO RELATED APPLICATIONS

This application is a filing under 35 U.S.C. 371 as the National Stage of International Application No. PCT/SG2012/000416, filed Nov. 2, 2012 and entitled "A Heat Sink Assembly Apparatus," which claims the benefit of and priority to U.S. Provisional Patent Application No. 61/554,546, filed Nov. 2, 2011 each of which is incorporated herein by reference in their entirety for all purposes.

FIELD OF THE INVENTION

The invention relates to apparatus used to dissipate heat, such as those used for small scale electronic devices.

BACKGROUND

With heat flux dissipation levels from small form factor devices skyrocketing, conventional cooling methods like air flow over extended surfaces etc. have been unable to keep pace with the cooling demands. Cooling by single phase flow through micro-channels have gained tremendous popularity as a promising alternative and is being commercialized rapidly. However, significant temperature variations across the heat sink persist since the heat transfer performance deteriorates in the flow direction in micro-channels as the boundary layers thicken and the coolant heats up by sensible heat gain. Hence, for very high heat flux dissipation from narrow spaces, flow boiling through micro-channels is evolving as a preferred cooling solution.

Two-phase flow instabilities may arise when boiling occurs in conventional size channels and more so in a parallel array of multiple micro/mini-channels. These undesired effects must be controlled or mitigated because they can induce mechanical vibrations in the system, degrade the heat transfer performances (premature dryout, CHF limitation) etc. Two-phase flow instability is a complex topic because several effects may occur simultaneously and play a role in a coupled way.

The classical theories developed for conventional size channels can be used to a limited extent for interpreting the instabilities phenomena observed in micro/mini-channels. In fact, when dealing with phase-change phenomena the basic mechanisms such as nucleation, coalescence, fragmentation, and interfacial instabilities still exist. Nevertheless, when micro/mini-channels are involved, some differences exist. For instance, in a small size channel the vapor growth phase is limited in the radial direction because of the hydraulic diameter. Only the axial direction allows vapor growth when boiling occurs. As a result there are important differences observed in the physical processes when compared to conventional macro-scale systems

SUMMARY OF INVENTION

In a first aspect the invention provides a heat sink assembly comprising a heat sink including a plurality of parallel fins, said fins defining a plurality of channels; said heat sink divided into two stages; said first stage positioned in the upstream portion of said heat sink and arranged such that fluid entering the heat sink is under closed channel flow conditions within said plurality of channels and; the second stage positioned in the downstream portion, said second stage including a void above said channels so as to have open channel flow in said channels for fluid exiting said heat sink.

Accordingly, by providing a void in the downstream second stage of the heat sink, problems associated with vapour growth limiting and hindering flow may be eliminated as the void permits open channel flow and so "degassing" the channels.

This has a further advantage in allowing an averaging effect across the channels in the second stage, and so reducing problematic differential flow issues, elevated temperatures, localized surface effects etc.

In one embodiment, the second stage void may progressively increase in size, and so progressively introduce the new flow characteristics.

In a further embodiment, the progressive increase in size may be achieved using shaped fins of the heat sink, for instance said fins may be shaped as a step function. Alternatively, the fins may be inclined in shape.

In a further embodiment, the fins may be of uniform height for the length of the flow path of the fluid, with the void created through a tapering or shaping of the capping of the heat sink.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

DETAILED DESCRIPTION

The invention comprises a two-stage arrangement with the first stage being an upstream portion of the heat sink assembly having fins maintaining the channels in isolation from each other. In the second stage, a void is created above the fins so as to create "open channel" flow in the channels and consequently facilitating transverse flow between the channels, as well as allowing the escape of vapour trapped within said channels.

Apart from the above advantages, this arrangement further provides for an averaging effect across the channels. Given the small dimensions and low flow, having differential flow, temperature and vapour formation becomes a specific problem. Facilitating transverse flow between the channels eliminates differential conditions by averaging the flow across channels.

Figure 1:
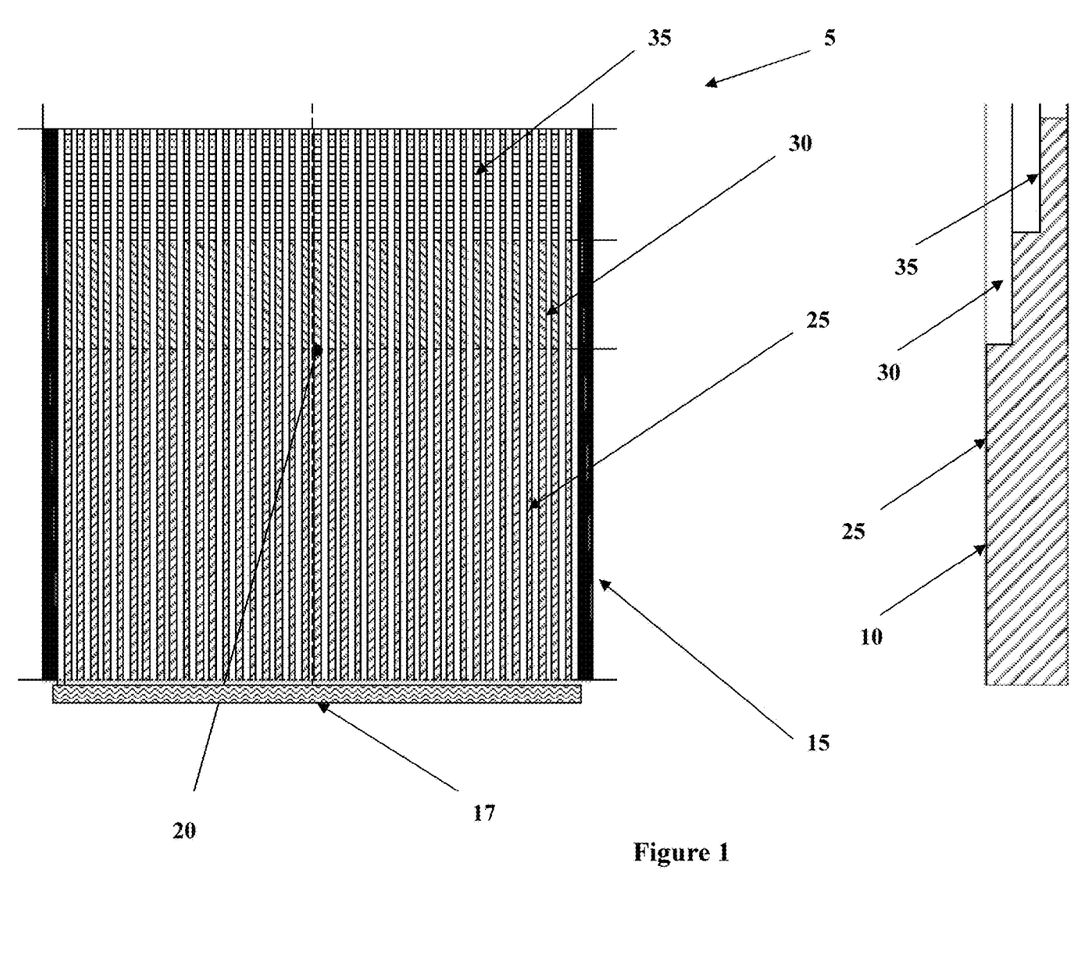
FIG. 1 is a plan view of a micro-channel heat sink according to one embodiment of the present invention.
Figure 2:
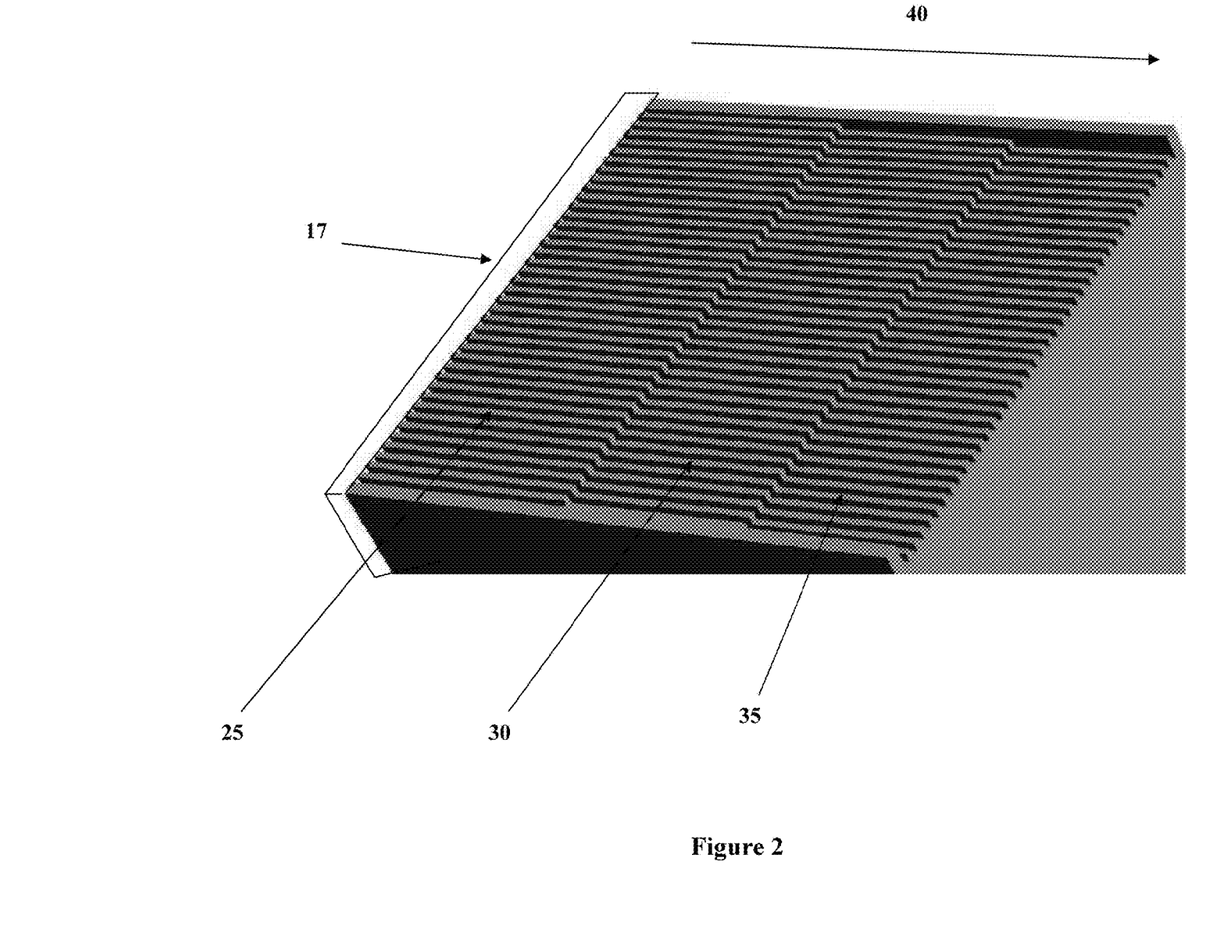
FIG. 2 is an isometric view of the micro-channel heat sink of FIG. 1.

In order to achieve this, FIGS. 1 and 2 show a possible embodiment of the present invention, whereby a heat sink assembly 5 includes a plurality of parallel fins 10, defining a plurality of parallel channels 20.

The channels are divided into a two stage arrangement whereby the first stage 25 is closed channel flow, and at the downstream end of the heat sink assembly 5, a second stage 30, 35 is formed through the creation of a void above the plurality of channels 20.

In this embodiment, an entry stage 17 may be provided upstream from the first stage as an example of a possible feature used in conventional heat sink assemblies. In one embodiment, the heat sink may include a entry stage for distributing and/or directing fluid into the first stage. Whilst the entry stage 17 may operate under open channel flow, it has no effect on the heat transfer process other than to act as a "manifold" zone. Typically, such entry stages are short compared with the length of the heat sink so as not to interfere with the flow characteristics or heat transfer effects of the heat sink. Where an entry stage is used for systems falling within the present invention, such features are not essential to the invention, nor do they detract from the first stage as an upstream zone of the heat sink. The invention is not limited in application to heat sink assemblies with or without such an entry stage, but may encompass both.

Similarly, a heat sink according to a further embodiment of the present invention may include an exit stage (not shown), acting as a drain for the fluid to deliver the cooled fluid to a downstream portion of the overall device. Such an exit stage, located downstream from the second stage, may also be arranged for open channel flow.

In this embodiment, the void is created by stepping the height of the fins to create two steps 30, 35 in the height of the fins, the reduced height in these regions allowing for the cross flow of fluid across the channels. Accordingly, as flow 40 moves from upstream to downstream, vapour growth that may lead to flow instability is permitted to escape into the void and so not disrupt optimal flow conditions.

Experiments on flow boiling were conducted in straight and stepped fin micro-channels. The test vehicles were made from copper with a footprint area of 25 mm×25 mm. The micro-channels were formed by wire cut Electro Discharge Machining process and have surface roughness (Ra) of about 2.0 μm. Tests were performed on channels having nominal width of 300 tan and a nominal aspect ratio of 4 over different mass velocity range and inlet temperature of 90° C. It was observed that the two phase pressure drop across the stepped fin micro-channel heat sink was significantly lower as compared to its straight counterpart. Moreover the pressure drop and wall temperature fluctuations were seen reduced in the stepped fin micro-channel heat sink. It was also noted that the stepped fin micro-channel heat sink had a better heat transfer performance than the straight micro-channel heat sink, under similar operating conditions. This phenomenon in stepped fin micro-channel heat sink is explained based on its improved flow boiling stability that reduces the pressure drop oscillations, temperature oscillations and hence partial dry out, by allowing the vapour to expand span wise and hence flow downstream with less resistance.

Both the straight and stepped fin micro-channel heat sinks have 40 channels of nominal width 300 nm. To facilitate easier comparison with the straight micro-channels, the stepped fin micro-channels were fabricated by reducing the fins height at selected location over a certain length similar to the arrangement shown in FIGS. 1 and 2.

Details of the channel geometry and the actual dimensions are given in Table #1.

TABLE #1

Channel geometry details with actual dimensions

| | Characteristic | |
|---|---|---|
| | Straight micro-channel | Stepped fin micro-channel |
| Material | Copper | |
| Footprint, width (mm) × length (mm) | 25 × 25 | |
| Fin width, ww (μm) | 272.8 | 284.67 |
| Channel width, wc (μm) | 322.5 | 311.68 |
| Channel depth, H1 (μm) | 1153.1 | 1186.9 |
| Channel depth, H2 (μm) | — | 805.8 |
| Channel depth, H3 (μm) | — | 407 |
| Maximum Aspect ratio, α | 3.25 | 3.81 |
| Number of channels, N | 40 | 40 |
| Fin length, L1 (mm) | — | 14.98 |
| Fin length, L2 (mm) | — | 4.98 |
| Fin length, L3 (mm) | — | 5.006 |

Experimental Procedure

The fluid is degassed prior to each experimental run. Degassing is achieved by boiling the water in the reservoir vigorously using an imbedded 1000 W cartridge heater for one hour. In each experiment, the power supply to the heaters is set to the desired value after the flow rate and the inlet fluid temperature are stabilized. Steady state is reached after about 20-30 min in each test run, when all temperature readings are within ±0.5° C. for about 2 min. All power, temperature, pressure and flow rate measurements are collected at a frequency of 50 Hz and averaged over a 1 min period. The heat flux is then increased for the next test, and the experimental procedure repeated. Experiments were conducted at mass fluxes ranging from 85 kg/m² s to 155 kg/m² s with an inlet water temperature of 90° C., for heat flux up to 140 W/cm².

The effective heat supplied to the fluid after the losses, is computed as $$q_{\mathit{eff}} = q - q_{\mathit{loss}} \qquad (1)$$

To evaluate the heat loss from the test section, single-phase heat transfer tests were conducted at same mass flow rates as used during flow boiling tests. It was observed that under single-phase condition, the percentage heat loss remained almost insensitive to the heat flux, for a particular flow rate. The heat loss varied from 10% to 19% over the range of flow rates considered. These percentage heat losses were directly used for the appropriate flow rates during the flow boiling tests, as a conservative approach.

The associated heat flux $q'^{\mathit{eff}}$ is calculated based on the footprint area of the heater which is same as the base of the micro-channel heat sink, A=W×L. This is also the reported heat flux that the heat sink can dissipate:

$$q''_{eff} = \frac{q_{eff}}{A} \quad (2)$$

The wall heat flux $q'_w$ is calculated based on the convective heat transfer area of the heat sink considered. Hence, for straight micro-channels $$q''_w = \frac{q_{eff}}{NL(w_c + 2H)} \quad (3)$$

and for stepped fin micro-channels $$q''_w = \frac{q_{eff}}{NL_1(w_c + 2H_1) + NL_2(w_c + 2H_2) + NL_3(w_c + 2H_3) + N(L_2 + L_3)w_w} \quad (4)$$

Water was supplied into the heat sink in a subcooled state ($T_{f,i} < T_{sat}$) for all test conditions. The micro-channels can therefore be divided into two regions: an upstream subcooled inlet region and a downstream saturated region; the location of zero thermodynamic equilibrium quality (x=0) serves as a dividing point between the two regions. Based on energy balance, length of the two regions can be evaluated as $$L_{sp} = \frac{\dot{m}c_p(T_{sat,0} - T_{f,i})}{q''_{eff}W} \quad (5)$$

and $$L_{sat} = L - L_{sp} \quad (6)$$

where $T_{sat,0}$ is the saturation temperature at the location where x=0. In the present study, $T_{sat,0}$ is evaluated using the measured inlet pressure, Pi, as pressure drop across the subcooled region is small. Eqs. (5) and (6) indicate as the heat flux increases for a constant mass flow rate, $L_{sat}$ increases at the expense of $L_{sp}$.

Determination of the local flow boiling heat transfer coefficient requires knowledge of local fluid temperature, micro-channel wall temperature, and heat flux. For the present test conditions, the heat transfer coefficient results were obtained only at location of the downstream thermocouple $t_{c3}$, which corresponds to the greatest degree of saturated boiling. For uniform heat flux conditions, the temperature of the fluid in the single-phase region will vary linearly according to the energy balance $$T_f = T_{f,i} + \frac{q''_{eff}Wz}{\dot{m}c_p} \quad (7)$$

Within the saturated region, the local fluid temperature is simply the local saturation temperature which is taken corresponding to the local pressure obtained as a linear interpolation between the inlet and outlet pressures which can be justified based on very low measured pressure drop (<0.015 bar). Considering the more complicated geometry in stepped fin micro-channels, this temperature is taken corresponding to the outlet pressure without appreciable error, again by reason of very low measured pressure drop.

$$T_f = T_{sat} \text{ (In saturated region)} \quad (8)$$

where $T_{sat}$=f(Pz) for straight micro-channels and $T_{sat}$=f(Po) for stepped fin micro-channels.

Direct measurement on micro-channel wall temperature is not available as the thermocouples are located at the bottom surface of thermal test dies. Thus, 1D conduction is assumed for the heat transfer from the bottom of the block to the base of micro-channel. Hence the local wall temperature is obtained as $$T_{w,tc3} = T_{tc3} - \frac{q''_{eff}d}{k_s} \quad (9)$$

where $T_{tc3}$ is the temperature of the thermocouple at the most downstream location. As the pressure taps are located upstream and downstream of the micro-channels in the inlet and outlet plenum, the measured pressure drop includes the sum of pressure drops across the bends from inlet plenum to the inlet manifold and from outlet manifold to the outlet plenum and the pressure loss and recovery resulting from the inlet contraction and outlet expansion, apart from the frictional drop across the micro-channels. It was identified that the other pressure losses apart from the frictional drop were less than 6% of the total drop, for the current test section, and hence were neglected. Hence the pressure values reported here are as directly obtained from the pressure transmitters.

The uncertainties in individual temperature measurements are ±0.5° C. for the T-type thermocouples. The measurement error for the flow meter is ±5 ml/min and the differential pressure transducer is ±0.5 mbar and that of the inlet pressure transducer is ±1.8 mbar. The uncertainty associated with the voltage and current measurements are estimated to be ±0.62V and ±0.035 A respectively. Hence the uncertainty in heat flux measurement is 1%-5%, with the maximum uncertainty at the minimum heat flux. The error in channel dimension measurement is ±10 μm. The uncertainty associated with the pressure drop measurements varied from 4%-18%. A standard error analysis revealed uncertainties in the reported heat transfer coefficients to be between 13.5%-17.5% at the highest heat flux conditions.

Figure 3A:
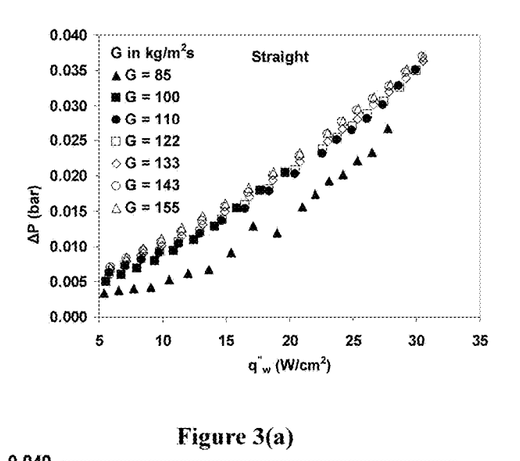
FIGS. 3(a) and 3(b) characteristics of the variation of pressure drop with wall heat flux as a function of mass flux for (a) Straight micro-channels (b) Stepped fin micro-channels.
Figure 3B:
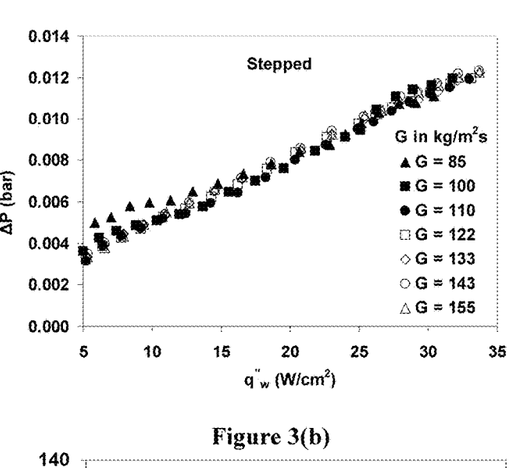

The pressure drop characteristics of both the straight and stepped fin micro-channels are shown in FIGS. 3 (a) and (b) respectively, as a function of mass flux.

FIG. 3 (a) shows that, in straight micro-channels, with increase in mass flux the pressure drop also increases, for a given heat flux. This is due to the strong wall friction and the body drag effects with increase in mass flux. However as observed from FIG. 3 (b), the mass flux has little or no effect on the pressure drop, within the range tested. Since the stepped fin micro-channels provide a large room for vapor expansion towards the downstream direction, the wall friction and body drag effects does not increase significantly with the increase in mass flux within this range thereby leaving the pressure drop unaffected.

Figure 4:
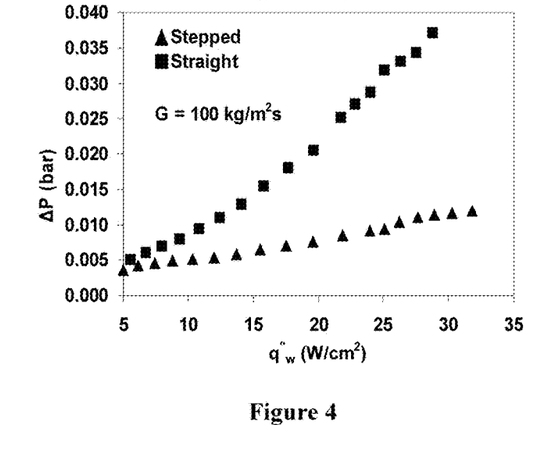
FIG. 4 is a characteristic of pressure drop variation with wall heat flux.

FIG. 4 compares the pressure drop characteristic of both the straight and stepped fin micro-channels at a mass flux of 100 kg/m² s. The curves indicate that pressure drop is significantly lower for stepped fin micro-channels, especially at higher heat fluxes, for a given mass flux. As explained above, this is attributed to the larger room for vapor expansion towards the channel downstream, which decelerates the vapor and reduces the pressure drop. Hence a very low pumping power is sufficient to drive the fluid through these channels, at similar heat flux conditions. Under the present operating conditions a pressure drop reduction close to 30% was observed at higher heat fluxes in the stepped fin micro-channels, compared to their straight counterpart.

Figure 5:
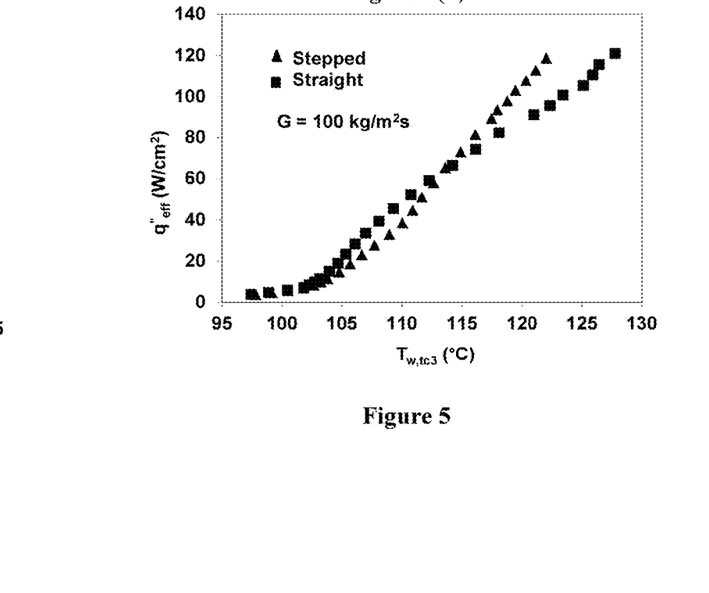
FIG. 5 is a characteristic of the variation of wall temperature with effective heat flux at $G=100$ kg/m$^2$ s.

The flow boiling curves for both the straight and stepped fin micro-channels are shown in FIG. 5. The plot shows the variation of wall temperature at the most downstream location, with effective heat flux based on foot print. Beyond the saturation temperature of water, at a wall superheat of about 3° C., there is sharp change in slope of the curves indicating the region of Onset of Nucleate Boiling (ONB). In FIG. 5, it is crucial to note that at higher heat fluxes the stepped fin micro-channels have lower wall temperature compared to the straight micro-channels. This was observed under all the mass flux conditions tested. This prompts better heat transfer performance of stepped fin micro-channels at higher heat fluxes, for a given mass flux.

Figure 6:
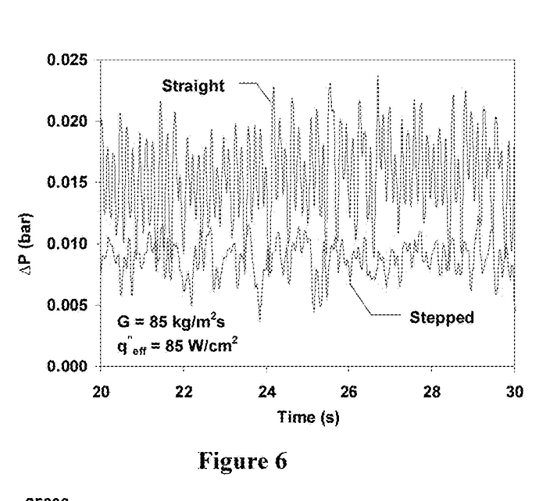
FIG. 6 is a characteristic of the pressure drop fluctuation at $G=85$ kg/m$^2$ s.
Figure 7:
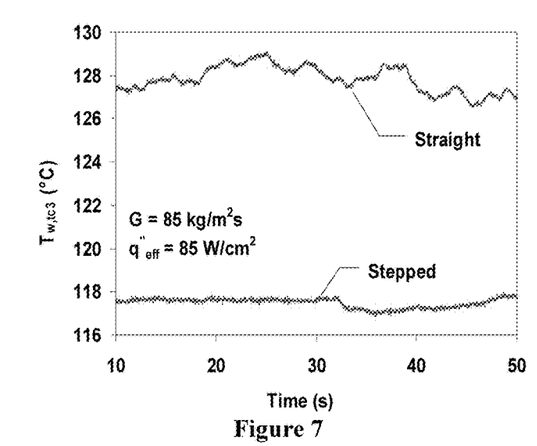
FIG. 7 is a characteristic of the wall temperature fluctuation at $G=85$ kg/m$^2$ s.
Figure 8:
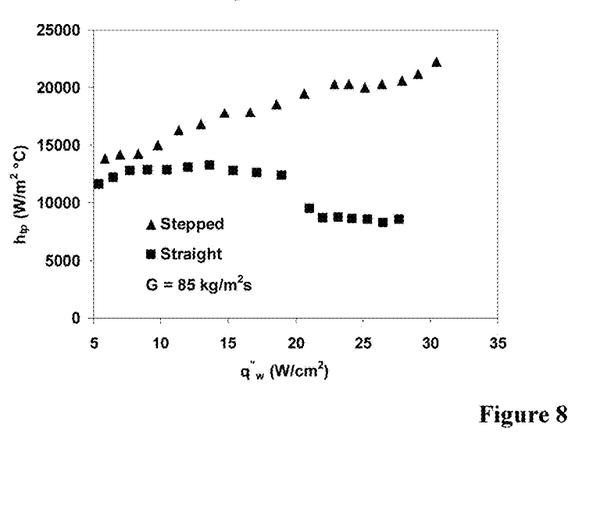
FIG. 8 is a characteristic of the variation of flow boiling heat transfer coefficient for stepped fin and straight micro-channels.

FIG. 6 shows the pressure drop fluctuation in the both the micro-channel geometries and FIG. 7 shows the wall temperature fluctuations similarly. The pressure drop fluctuations in straight micro-channels are more severe than in stepped fin micro-channels as observed in FIG. 6. The standard deviation of the pressure drop values can be considered as a good measure of the degree of fluctuation. For the straight micro-channels it is computed as 0.0035 and that for the stepped fin micro-channels as 0.0016. Also, the comparison of wall temperature fluctuations show that, while the stepped fin micro-channels have almost steady wall temperature (standard deviation=0.21), the straight micro-channels face significant fluctuations (standard deviation=0.81). This improved stability is attributed as one of the reasons for better heat transfer performance of the stepped fin micro-channels, at higher heat fluxes, in spite of it having a lower convective heat transfer area. It should be noted that a larger reduction in heat transfer area, by cutting the fins, might reduce the heat transfer performance of the heat sink, though its stabilizing effect may improve.

Figure 9:
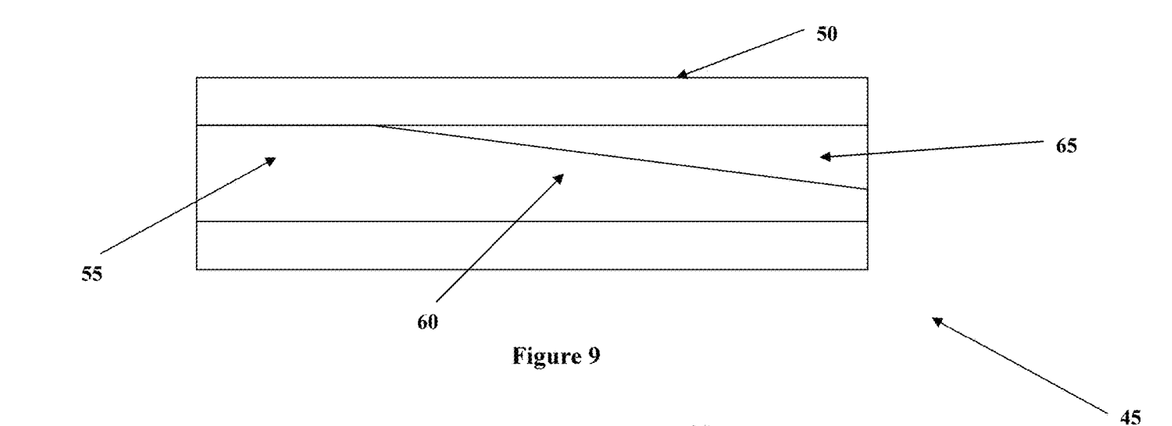
FIG. 9 is an elevation view of a micro-channel heat sink according to a further embodiment of the present invention.
Figure 10:
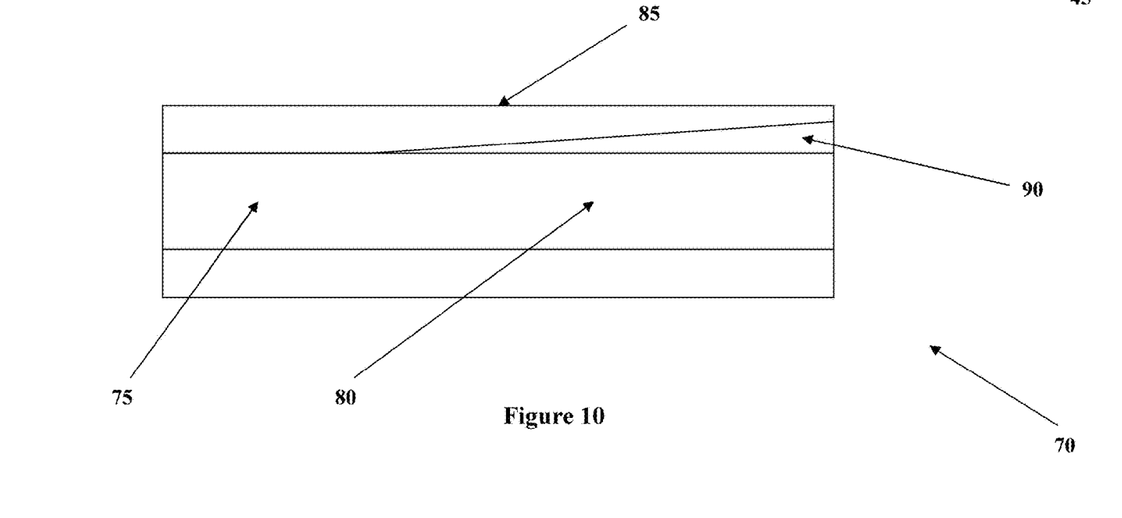
FIG. 10 is an elevation view of a micro-channel heat sink according to a further embodiment of the present invention.

To demonstrate, by way of example, the range of possible arrangements falling within the scope of the present invention, FIGS. 9 and 10 show alternative arrangements of the heat sink assembly.

FIG. 9 shows a heat sink assembly 45 having an array of fins divided into a first stage 55 and second stage 60. Consistent with the present invention, the first stage is arranged as closed channel flow and the second stage, downstream of the first, is open channel flow. Similar in concept to the stepped function whereby the void 65 progressively increases in size, the embodiment of FIG. 9 achieves this through an inclined height reduction of the fins, and so forming a sloping effect to the profile of the fins. The angle of slope of the fins will depend upon the design of the heat sink and the proportion of the first stage to the second stage, which are matters of design The inclined shape of the fins have the advantage of an infinitely increasing void and so progressively applying the advantages to flow conditions as flow moves down stream. It may further be easier to fabricate than the stepped arrangement, particularly compared to fins having a high number of steps. It will be noted that the invention does not limit the number of steps in order to achieve the two stage arrangement, and so the embodiment of FIG. 9 may be viewed as a logical progression of an infinite number of steps.

In a further embodiment, the heat sink assembly 70 of FIG. 10 shows a progressively increasing void from the first stage 75 to the second stage 80. However, the two stage arrangement is achieved by having a progressively reducing thickness of the heat sink capping 85 and so a "reverse slope" to the capping rather than affecting the fins. Thus, the void 90 required by the present invention still exists, however it is achieved by the manufacture of the capping 85 rather than fabricating fins. The manufacturing advantage of this embodiment is clearly demonstrated by having a single, much larger, component needing special fabrication, rather than a many smaller and very much thinner fin components.

It will be appreciated that the void created required by the invention could be a combination of FIG. 10 and any other embodiment whereby the fins are shaped. In this way, the void is cumulatively formed by both the fins and capping. For instance, the capping of FIG. 10 may be applied to the sloping fins of the heat sink of FIG. 9. Equally the capping of FIG. 10 may be applied to the stepped fins of FIGS. 1 and 2.

The following are key conclusions drawn from the results, within the range of heat and mass fluxes tested.

Pressure drop in stepped fin micro-channels may be significantly lower, for instance close to 30%, than the straight micro-channels and hence a low pumping power is sufficient to drive the fluid through these micro-channels, for similar heat flux dissipation.

The stepped fin micro-channels have better stabilizing effect compared to the straight micro-channels.

The stepped fin micro-channels have improved heat transfer characteristics and thereby maintain a lower surface temperature for the same wall heat flux and coolant mass flux compared to the straight micro-channels owing to improved stability.

| | Nomenclature | | Subscripts |
|---|---|---|---|
| A | Footprint area, m2 | c | Channel |
| L | Substrate length, m | f | Fluid |
| N | Number of channels | i | Inlet |
| P | Fin perimeter, m | s | Substrate |
| T | Temperature, ° C. | sat | Saturation |
| cp | Specific heat capacity, kJ/kgK | sp | Single Phase |
| h | Heat transfer coefficient, W/m2K | o | Outlet |
| k | Thermal conductivity, W/mK | $t_{ci}$ | ith thermocouple |
| G | Mass flux, kg/m2s | W | Wall |
| ṁ | Mass flow rate, kg/s | | |
| $h_{fg}$ | Heat of vaporization, J/kg | | |
| q | Heat transfer rate, W | | |
| q" | Heat flux, W/m2 | | |
| d | Distance from thermocouple to channel bottom wall, m | | |
| w | Width, m | | |
| W | Width of the substrate, m | | |

The invention claimed is:

1. A heat sink assembly comprising:
a heat sink including a plurality of parallel fins, said fins defining a plurality of channels, and a capping over said fins, said capping shaped to create a void in a space provided by the capping;
said heat sink divided into two stages;
a first stage of the two stages positioned in an upstream portion of said heat sink and arranged such that liquid entering the heat sink is under closed channel flow conditions within said capping enclosing said plurality of channels and;

a second stage of the two stages positioned in a downstream portion and arranged to receive the liquid from the first stage, said second stage including said void above said channels, said void arranged to provide room for vapor expansion so as to have open channel flow in said channels for liquid exiting said heat sink to escape from said channels, wherein the channels are arranged such that the fluid flows in a longitudinal direction of the channels from the first stage to the second stage and exiting the heat sink, and wherein the void increases from the first stage to the second stage based at least on a decreasing thickness of the capping.

2. The heat sink assembly according to claim 1, further including an entry stage positioned upstream from the first stage said entry stage arranged to receive an inflow of fluid for distribution to the first stage said entry stage having open channel flow conditions.

3. The heat sink assembly according to claim 1, wherein the void progressively increases in size along the flow path of the fluid.

4. The heat sink assembly according to claim 1, wherein the fins are shaped so as to decrease in height along the flow path of the fluid.

5. The heat sink assembly according to claim 1, wherein the fins are shaped as a step function such that the void progressively increases in size along the flow path of the fluid in steps.

6. The heat sink assembly according to claim 4, wherein the fins are shaped to be inclined.

7. The heat sink assembly according to claim 1, wherein the fins are shaped to be a uniform height.

8. The heat sink assembly according to claim 1, wherein the fins are shaped to decrease in height along the flow path of the fluid such that the void is formed by both the capping and the fins.

9. The heat sink assembly according to claim 1, wherein the void above the channels in the second stage is arranged to allow fluid to flow in a transverse direction of the channels.

* * * * *